US006555482B2

(12) United States Patent
Skotnicki et al.

(10) Patent No.: US 6,555,482 B2
(45) Date of Patent: Apr. 29, 2003

(54) PROCESS FOR FABRICATING A MOS TRANSISTOR HAVING TWO GATES, ONE OF WHICH IS BURIED AND CORRESPONDING TRANSISTOR

(75) Inventors: Thomas Skotnicki, Crolles Montfort (FR); Malgorzata Jurczak, Grenoble (FR); Michel Haond, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 11 days.

(21) Appl. No.: 09/812,717

(22) Filed: Mar. 20, 2001

(65) Prior Publication Data
US 2001/0053569 A1 Dec. 20, 2001

(30) Foreign Application Priority Data
Mar. 27, 2000 (FR) .............................. 00 03844

(51) Int. Cl.⁷ ...................... H01L 21/302; H01L 21/461
(52) U.S. Cl. ...................... 438/738; 438/214; 438/494; 438/588
(58) Field of Search ................................ 438/154, 157, 438/199, 214, 275, 280, 283, 493–494, 588, 735, 737–739

(56) References Cited
U.S. PATENT DOCUMENTS 5,120,666 A * 6/1992 Gotou ............... 148/DIG. 150
5,349,228 A    9/1994 Neudeck et al. ............ 257/365
5,372,959 A * 12/1994 Chan ................ 148/DIG. 164
5,482,877 A *  1/1996 Rhee ........................ 438/157
5,578,513 A   11/1996 Maegawa .................... 437/40
5,965,914 A   10/1999 Miyamoto ................... 257/331
6,004,837 A   12/1999 Gambino et al. .......... 438/157

* cited by examiner

Primary Examiner—Amir Zarabian
Assistant Examiner—Jamie L. Brophy
(74) Attorney, Agent, or Firm—Allen, Dyer, Doppelt, Milbrath & Gilchrist, P.A.; Lisa K. Jorgenson

(57) ABSTRACT

A method for making a MOS transistor includes forming a first gate within a silicon-on-insulator substrate, forming a semiconductor channel region transversely surmounting the first gate, and forming semiconductor drain and source regions on each side of the channel region. The semiconductor channel region and drain and source regions may be produced by epitaxy on an upper surface of the first gate. The channel region may be isolated from the upper surface of the first gate by forming a tunnel under the channel region and at least partially filling the tunnel with a first dielectric. The second gate is formed on the channel region and transverse to the channel region. The second gate may be separated from an upper surface of the channel region by a second dielectric.

20 Claims, 4 Drawing Sheets

PROCESS FOR FABRICATING A MOS TRANSISTOR HAVING TWO GATES, ONE OF WHICH IS BURIED AND CORRESPONDING TRANSISTOR

FIELD OF THE INVENTION

The present invention relates to the field of integrated circuits and their fabrication, and, more particularly, to complementary metal oxide semiconductor (CMOS) transistors having a dual-gate architecture.

BACKGROUND OF THE INVENTION

The present invention relates particularly to CMOS transistors formed on a silicon-on-insulator (SOI) substrate and having a dual-gate architecture with one of the gates "buried" in the SOI substrate. For such transistors, the use of dual metal gates is particularly desirable for reducing parasitic phenomena that could damage a semiconductor device. Such parasitic phenomena may include boron penetration, gate depletion, and the incorporation of certain high-permitivity dielectrics, for example.

The main problem caused by metal gates relates to the adjustment of the threshold voltage. This is because common materials used for N-channel MOS (NMOS) and P-channel MOS (PMOS) devices typically include so-called mid-gap materials. These materials shift the threshold voltage of an NMOS by $½E_g$ toward positive values and that of a PMOS by $½E_g$ toward negative values (where $E_g$ represents the band-gap energy of the material). For constant channel doping, this results in threshold voltages on the order of ±1 V for NMOS devices and PMOS devices, respectively. To bring these values back to conventional values on the order of ±0.5 V on long channels, counter-doping of the channels may be necessary. However, the buried channels obtained thereby have the disadvantage of being particularly sensitive to short-channel effects.

Various attempts have been made to eliminate the defects associated with buried channels, especially with respect to the use of a single mid-gap type material. Yet, these attempts typically use an SOIAS dual-gate architecture (see "Back-gated CMOS on SOIAS for dynamic threshold voltage control" by I. Y. Yang, C. Vieri, A. Chandraskasan and D. Antoniadis, pp. 822–31, IEEE T. Electron Devices, Vol. 44, May 1997). The principle of threshold voltage reduction by biasing the SOI substrate is also known (M. Haond and M. Tack, "Rapid electrical measurement of back oxide and silicon thickness in an SOI CMOS process", IEEE T. Electron Devices, pp. 674–6, Vol. 38, March 1991). Antoniadis et al. have used this principle to obtain, in a process called "substrate bonding" (or wafer bonding) of two SOI substrates, $p^+$ and $n^+$ polysilicon buried gates aligned with the metal gates present on the front face.

The drawbacks of this process are that it requires two substrates, one of which is an SOI substrate (which is expensive), and expensive wafer bonding techniques. From an electrical standpoint, there may also be considerable leakage between the $n^+$ and $p^+$ buried gates since these are separated only by intrinsic polysilicon regions.

SUMMARY OF THE INVENTION

An object of the present invention is to provide a process for fabricating dual-gate CMOS transistors that are simple and reliable.

Another object of the present invention is to provide dual-gate CMOS transistors and a process for fabrication thereof which allow for adjusting the voltage threshold of the NMOS and PMOS transistors by constant or dynamic biasing of a second buried gate. The efficacy of the buried gate may be enhanced by the use of a thin buried oxide provided by thermal oxidation, in the same way as the gate oxide of a conventional gate, for example.

Yet another object of the invention is to provide a simplified fabrication process requiring only a single SOI wafer (without any wafer bonding) for producing the above devices.

According to the invention, a process is for fabricating a MOS transistor including a semicondcutor channel region sandwiched between a first and a second gate. The first gate of the MOS transistor is formed within a silicon-on-insulator substrate. A semiconductor channel region is formed transversely surmounting the first gate, and semiconductor drain and source regions are formed on each side of the channel region, respectively. The semiconductor channel and semicondcutor source/drain regions are formed by epitaxy on the upper surface of the substrate. Furthermore, the channel region may be isolated from the upper surface of the first gate by forming a tunnel under the channel region and then at least partially filling the tunnel with a first dielectric. The second gate, which may be metal, for example, may be separated from the upper surface of the channel region by a second dielectric. The second gate may be formed on, and transverse to, the channel region.

More particularly, the first gate may be produced by forming isolating regions in the substrate defining an active zone and by doping the active zone. The semiconductor channel region may be formed by selective epitaxy of a layer of a first semiconductor on the upper surface of the active zone and by non-selective epitaxy on a layer of a second semiconductor. The first semiconductor may be selectively removable with respect to the substrate and with respect to the second semiconductor. Furthermore, the first and second semiconductor layers may be etched on the active surface to form a stack transversely surmounting the active zone and having two opposed sidewalls in which the first layer is exposed. Moreover, the first layer of the stack may be selectively etched to make the tunnel separating corresponding portions of the second semiconductor layer from the upper surface of the active zone. The first semiconductor may be a silicon-germanium alloy and the second semiconductor may be silicon.

Advantageously, the tunnel may be at least partially filled by forming a layer of the first dielectric on the semiconductor structure after the tunnel has been etched. The layer of the first dielectric may be formed by thermal oxidation or by deposition, for example. Preferably, the thickness of the layer of the first dielectric and the thickness of the layer of the first semiconductor are adjusted to completely fill the tunnel. This allows better control of the channel by the gate and better mechanical stability.

Additionally, the second gate may be formed by depositing a gate material on the layer of the first dielectric and by etching this layer to form the second gate. For example, the deposited gate material may be a metal or a $Si_xGe_{1-x}$ alloy (where $0 \leq x \leq 1$) doped $n^+$ or $p^+$ depending on the channel type of the transistor. The portion of the layer of the first dielectric between the upper surface of the channel region and the lower surface of the second gate thus forms the second dielectric. The second gate may also be produced by a process of the "damascene" type, for example, which will readily be understood by those skilled in the art. Each of the first dielectric and the second dielectric may be chosen from at least one of $SiO_2$, $Si_3N_4$, $Al_2O_3$, $Ta_2O_5$, $HfO_2$, $ZrO_2$, $TiO_2$ and any other dielectric having a high relative permitivity, e.g., greater than 50.

A semiconductor device according to the present invention, such as a MOS transistor, for example, is also provided and includes a channel region sandwiched between a first and a second gate. Further, the first gate is within a silicon-on-insulator substrate. The transistor also includes a semiconductor region surmounting the first gate and extending transversely to it, a channel region, and drain and source regions on each side of the channel region, respectively. The channel region may be isolated from the upper surface of the first gate by a tunnel at least partially filled with a first dielectric. Furthermore, the second gate may be on the channel region and transverse to the channel region. The second gate may be separated from the upper surface of the channel region by a second dielectric. Specifically, the tunnel preferably has a height of about 1 to 50 nm, e.g., about 20 nm.

BRIEF DESCRIPTION OF THE DRAWINGS

Further advantages and characteristics of the invention will become apparent upon examination of a detailed description of embodiments and method of implementation, given by way of non-limitative example, and the appended drawings, in which.

DETAILED DESCRIPTION OF THE PREFERRED EMBODIMENTS

Figure 1A:
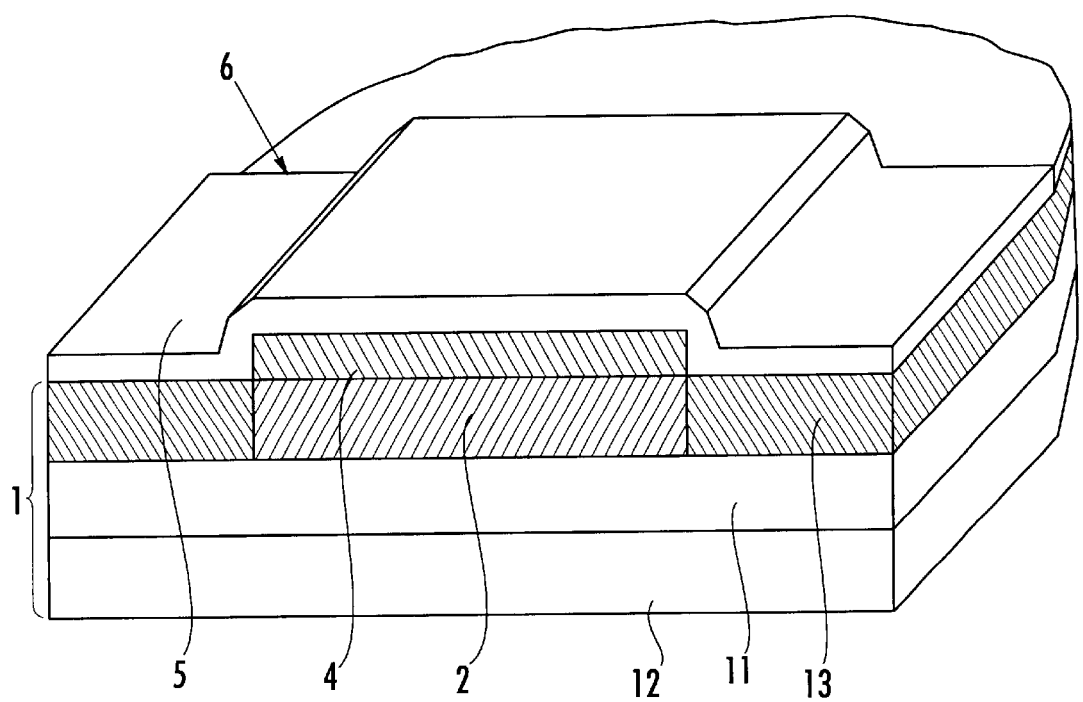
FIGS. 1a to 1f are perspective, partially cross-sectional views illustrating a method of making a semiconductor device according to the present invention.

With reference to FIG. 1a, a silicon-on-insulator (SOI) substrate 1 includes a thin silicon film acting as substrate on an insulator 11. The insulator 11 is on a wafer 12, which may be made of silicon or glass, for example. The fabrication of a silicon-on-insulator substrate is well known to those skilled in the art.

Isolating regions 13, which may be filled with an insulator, for example, are formed in the substrate. The isolating regions 13 may be formed by a process known to those skilled in the art as shallow trench isolation (STI), for example. These isolating trenches 13 define an active zone 2 in the substrate 1 for the future MOS transistor.

It should be noted here that FIGS. 1a to 1e illustrate the fabrication of a single- or P-channel MOS transistor. It will be understood that the complementary transistor is produced simultaneously alongside this MOS transistor, where the upper buried gates of the NMOS and PMOS transistors are produced within common materials.

The active zone 2 is then highly doped in the same way as a source/drain doping (e.g., on the order of $10^{15}$ atoms/$cm^2$) to obtain a dopant concentration on the order of $10^{20}$ atoms/$cm^3$. This is done to produce high conductivities in the active zones, which will serve as a buried gate. The implantation is- or P-type depending on the type of transistor.

The process continues with a phase of selective silicon-germanium (SiGe) epitaxy on the upper surface of the substrate 1. The selective nature of the epitaxy allows the SiGe layer 4 to grow only on the upper surface of the active zone 2. The layer 4 of SiGe alloy and the surface of the isolating peripheral region 13 are then covered using non-selective epitaxy to produce a silicon layer 5.

Among the SiGe alloys that may be used, mention may be made of the alloys $Si_{1-x}Ge_x$ (where 0<x<1) and $Si_{1-x-y}Ge_xC_y$ (where $0<x\leqq0.95$ and $0<y\leqq0.05$). It is preferred that an SiGe alloy be used having a Ge content such that $x\geqq0.05$, and preferably such that $0.20\leqq x\leqq 0.30$, since the selectivity of the etching with respect to Si increases when the Ge content in the alloy increases. The conditions of the selective epitaxy and of the non-selective epitaxy are conventional conditions well known to those skilled in the art. For example, a stream of dichlorosilane and of dichlorogermanium may be used for selective epitaxy, and a stream of silane for non-selective epitaxy.

Figure 1B:
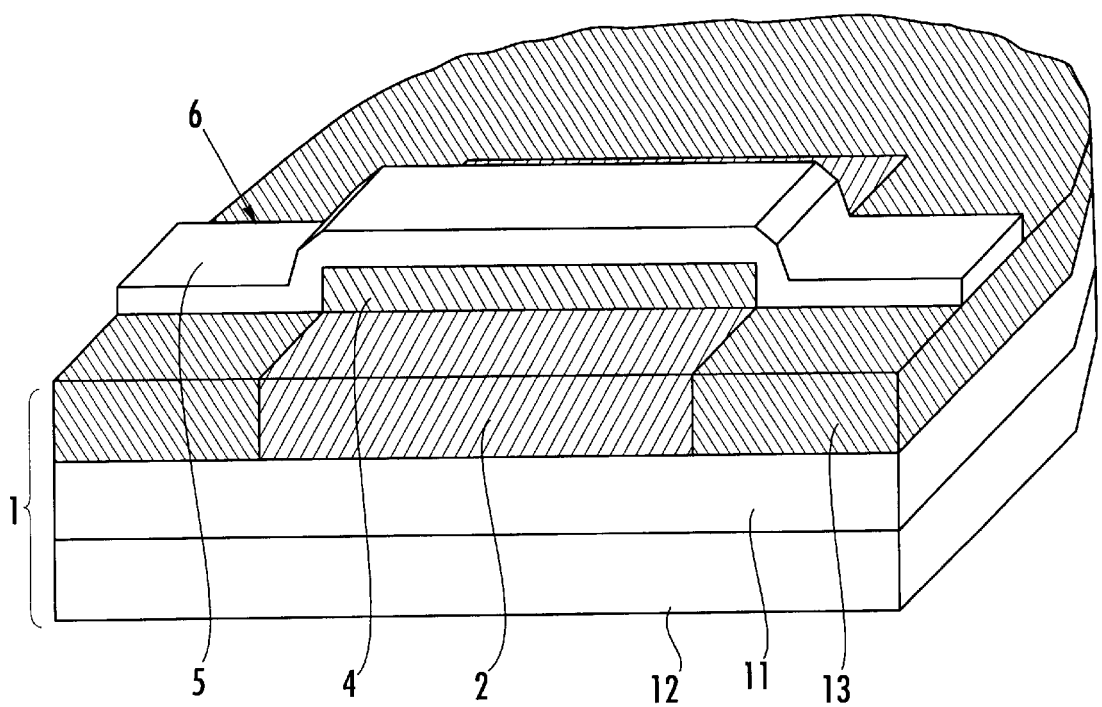

The process then continues, as shown in FIG. 1b, by masking and etching the silicon layer 5 and the SiGe alloy layer 4 to form, on the surface of the active region 2, a stack 6 of SiGe alloy 4 and silicon 5 layers. The stack 6 has two opposed sidewalls on the active region 2 where the SiGe alloy layer 4 is exposed.

Figure 1C:
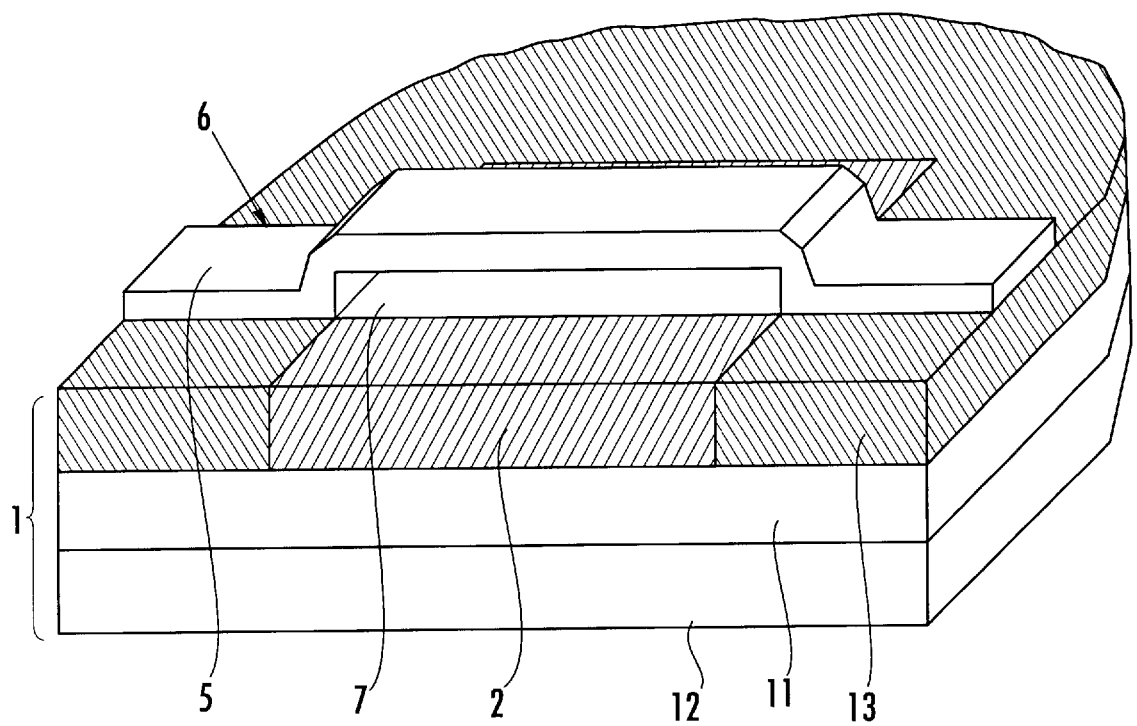

Further, selective etching of the SiGe alloy layer 4 is performed to form the tunnel 7 (FIG. 1c) whose height is intentionally exaggerated in FIG. 1c. Preferably, the tunnel has a height of about 1 to 50 nm, e.g., of about 20 nm. As is also well known to those skilled in the art, SiGe alloys are easily selectively removable, either by a wet oxidizing chemistry (e.g., using a solution containing 40 ml of 70% $HNO_3$+20 ml of $H_2O_2$+5 ml of 0.5% HF) or by isotropic plasma etching.

Figure 1D:
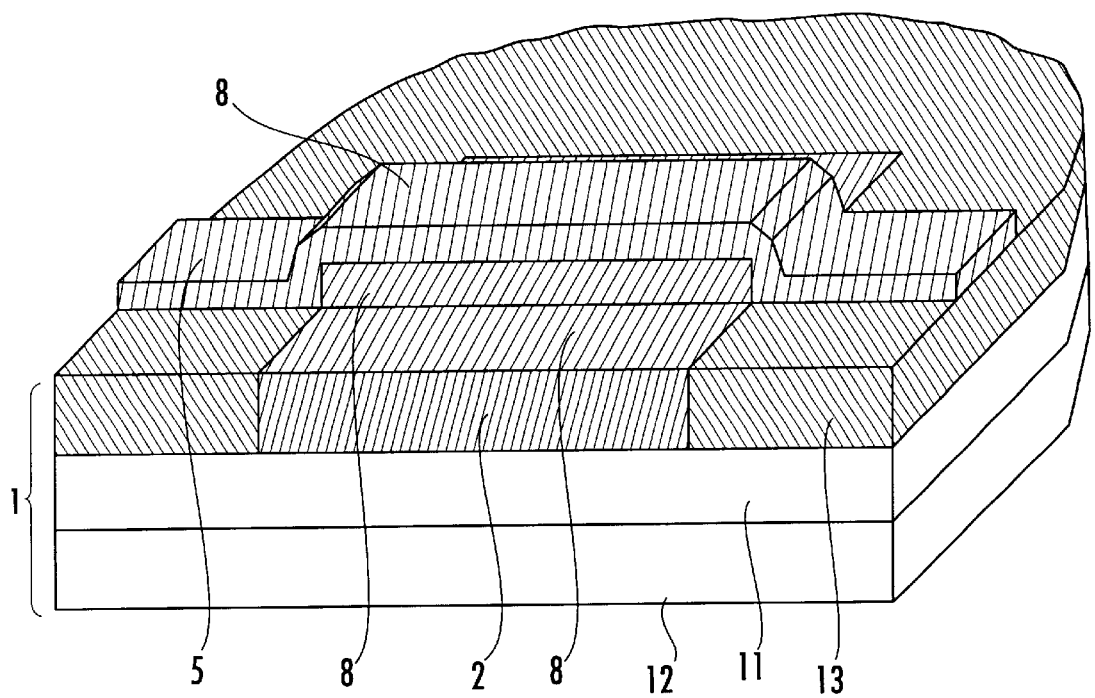

Next, as shown in FIG. 1d, a thin layer 8 of silicon oxide $SiO_2$ is formed, for example, by thermal oxidation or by deposition, on the surface of the active region 2 and the internal surface of the tunnel. This same thermal oxidation or deposition step also leads to the external surface and the sidewalls of the bridging structure being covered with the silicon oxide layer. The thickness of the $SiO_2$ layer and the thickness of the layer of the first semiconductor 4 (SiGe) are preferably adjusted to completely fill the tunnel.

Figure 1E:
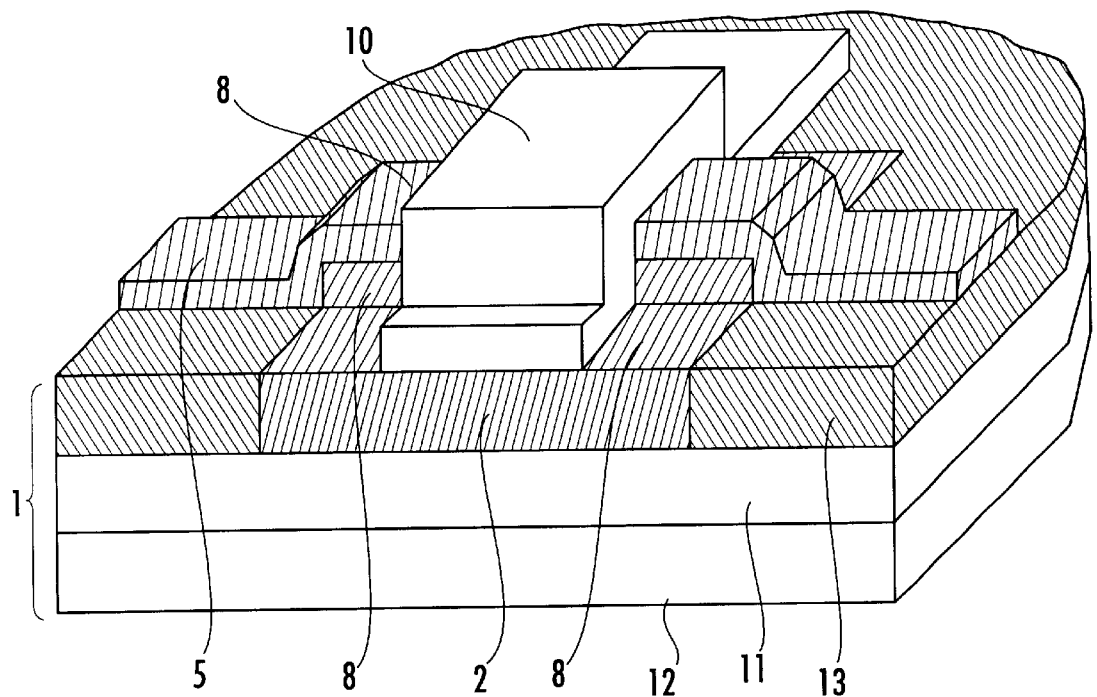

A layer of metal or of $Si_xGe_{1-x}$ alloy doped $n^+$ or $p^+$, depending on the type of transistor, is then conventionally deposited (FIG. 1d) to cover the entire surface of the structure (previously illustrated in FIG. 1c) and, consequently, the bridging structure. The $n^+$-doped or $p^+$-doped $Si_xGe_{1-x}$ alloy layer may be doped in situ in a conventional manner. Next, as shown in FIG. 1e, the layer of metal or of $n^+$-doped or $p^+$-doped $Si_xGe_{1-x}$ alloy is etched using conventional photolithographic etching techniques to form the second gate 10 of the transistor. The two gates 10 of the NMOS and PMOS transistors form the dual gates on the front face of these CMOS transistors.

Next, after deoxidation, the source/drain implantations in the silicon layer 5 are performed in a conventional manner. This may be preceded by the formation of isolating lateral regions (or spacers) to provide zones of variable concentration (these zones are known by those skilled in the art by the name LDD). An activation annealing step and a conventional siliciding step complete the fabrication of the transistor.

Figure 1F:
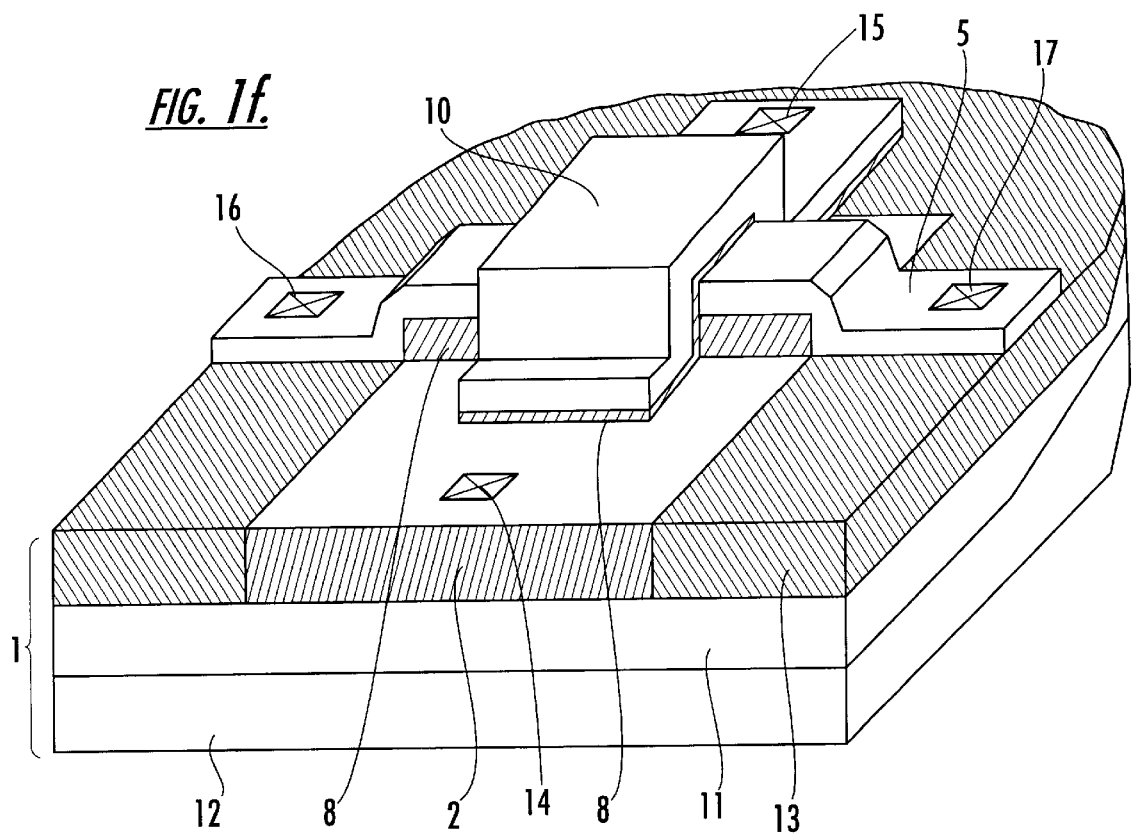

A transistor according to the invention is shown in FIG. 1F. Neither the spacers nor the silicided zones have been shown for the sake of clarity. The transistor includes a buried gate 2 having a gate contact 14 thereon. This buried gate is isolated from the second gate 10 by the silicon oxide layer 8. The layer 8 also isolates the gate 10 from the channel region lying in the layer 5, i.e., it is isolated from the buried gate by the tunnel 7 filled with the silicon oxide 8. The transistor also has the particular feature of providing a channel projecting from the initial silicon surface and forming a bridge between the ends of the active zone 2 (i.e., the buried gate). Moreover, the bridge is narrower than the buried gate and also rests on the isolating regions 13.

The upper gate 10 surmounts the bridge, and the source and drain regions rest on the isolating zones 13. Source/drain contacts 16 and 17 are made on the layer 5 above the isolating zones 13. A gate contact 15 is made on the gate 10 above the isolating zone 13.

By way of non-limiting example, a tunnel having a length of 600 nm was selectively etched in a SiGe layer 4 having a thickness of 20 nm beneath a silicon layer 5 having a thickness of 20 nm. In practice, the height of the tunnel (i.e., the thickness of the dielectric filling the tunnel) is preferably about twice the thickness of the upper dielectric 8.

The silicon layer 5 above the tunnel has a substantially perfect single-crystal structure and thickness uniformity. The defects appearing in the silicon layer 5 at the edge of the isolating peripheral region 13 (going from single-crystal Si to polycrystalline Si) have substantially no effect on the channel of the transistor. This is because on both opposed sidewalls the defects are removed by etching of the layer 5 and, on the other two sides, they are located inside the source and drain junctions away from the channel.

Moreover, the growth of the SiGe alloy followed by photo-etching without any intermediate step favors its stability and allows greater thicknesses and higher amounts of Ge. This also favors the thermal budget of the complete process, which is not compromised by possible relaxation of the SiGe alloy. Additionally, the two gates may be biased independently or may be electrically connected to adjust the threshold voltage dynamically.

That which is claimed is:

1. A method for fabricating a MOS transistor comprising:
    forming a first gate in a surface of a silicon-on-insulator (SOI) substrate by forming isolating regions in the SOI substrate defining an active zone and doping the active zone;
    epitaxially forming a semiconductor channel region on the surface of the SOI substrate transversely surmounting the first gate;
    isolating the semiconductor channel region from the first gate by forming a tunnel under the semiconductor channel region and at least partially filling the tunnel with a first dielectric;
    forming a second dielectric on an upper surface of the semiconductor channel region;
    forming a second gate on the second dielectric and transverse to the semiconductor channel region so that the second dielectric separates the semiconductor channel region from the second gate; and
    epitaxially forming a semiconductor drain region and a semiconductor source region on opposing sides of the semiconductor channel region so that the first gate is between the semiconductor drain and source regions.

2. The method according to claim 1 wherein forming the semiconductor channel region comprises:
    forming a first semiconductor layer by selective epitaxy on an upper surface of the active zone;
    forming a second semiconductor layer by non-selective epitaxy on the first layer; and
    etching the first and second semiconductor layers to form a stack on the upper surface transversely surmounting the active zone, the stack having two opposing sidewalls each exposing the first semiconductor layer.

3. The method according to claim 2 wherein forming the tunnel under the semiconductor channel region comprises selectively etching the first semiconductor layer to define the tunnel separating corresponding portions of the second layer from the upper surface of the active zone.

4. The method according to claim 3 wherein the tunnel is at least partially filled by forming a layer of the first dielectric on the stack after the tunnel has been etched.

5. The method according to claim 4 wherein the layer of the first dielectric is formed by at least one of thermal oxidation and deposition.

6. The method according to claim 4 wherein a thickness of the layer of the first dielectric and a thickness of the first semiconductor layer are adjusted to completely fill the tunnel.

7. The method according to claim 4 wherein forming the second gate comprises:
    depositing a gate material layer on the layer of the first dielectric; and
    etching the gate material layer to form the second gate so that portions of the layer of the first dielectric between an upper surface of the semiconductor channel region and a lower surface of the second gate define the second dielectric.

8. The method according to claim 2 wherein the first semiconductor layer comprises a silicon-germanium alloy and the second semiconductor layer comprises silicon.

9. The method according to claim 1 wherein the first dielectric and the second dielectric each comprises at least one of $SiO_2$, $Si_3N_4$, $Al_2O_3$, $Ta_2O_5$, $HfO_2$, $ZrO_2$, and $TiO_2$.

10. The method according to claim 1 wherein the first dielectric and the second dielectric each comprises a dielectric having a high relative permitivity.

11. A method for fabricating a semiconductor device comprising:
    forming a first gate in a silicon-on-insulator (SOI) substrate by forming isolating regions in the SOI substrate defining an active zone and doping the active zone;
    forming a semiconductor channel region on the SOI substrate above the first gate;
    isolating the semiconductor channel region from the first gate by forming a tunnel under the semiconductor channel region and at least partially filling the tunnel with a first dielectric;
    forming a second dielectric on the semiconductor channel region; and
    forming a second gate on the second dielectric and above the semiconductor channel region so the second dielectric separates the semiconductor channel region from the second gate.

12. The method according to claim 11 wherein forming the semiconductor channel region comprises:
    forming a first semiconductor layer by selective epitaxy on an upper surface of the active zone;
    forming a second semiconductor layer by non-selective epitaxy on the first layer; and
    etching the first and second semiconductor layers to form a stack on the upper surface transversely surmounting the active zone, the stack having two opposing sidewalls each exposing the first semiconductor layer.

13. The method according to claim 12 wherein forming the tunnel under the semiconductor channel region comprises selectively etching the first semiconductor layer to define the tunnel separating corresponding portions of the second layer from the upper surface of the active zone.

14. The method according to claim 13 wherein the tunnel is at least partially filled by forming a layer of the first dielectric on the stack after the tunnel has been etched.

15. The method according to claim 14 wherein the layer of the first dielectric is formed by at least one of thermal oxidation and deposition.

16. The method according to claim 14 wherein a thickness of the layer of the first dielectric and a thickness of the first semiconductor layer are adjusted to completely fill the tunnel.

17. The method according to claim 14 wherein forming the second gate comprises:
- depositing a gate material layer on the layer of the first dielectric; and
- etching the gate material layer to form the second gate so that portions of the layer of the first dielectric between an upper surface of the semiconductor channel region and a lower surface of the second gate define the second dielectric.

18. The method according to claim 12 wherein the first semiconductor layer comprises a silicon-germanium alloy and the second semiconductor layer comprises silicon.

19. The method according to claim 11 wherein each of the first dielectric and the second dielectric comprises at least one of $SiO_2$, $Si_3N_4$, $Al_2O_3$, $Ta_2O_5$, $HfO_2$, $ZrO_2$, and $TiO_2$.

20. The method according to claim 11 further comprising forming a semiconductor drain region and a semiconductor source region on opposing sides of the semiconductor channel region so that the first gate is between the semiconductor drain and source regions.

* * * * *